United States Patent
Ge et al.

(10) Patent No.: US 7,471,752 B2
(45) Date of Patent: Dec. 30, 2008

(54) DATA TRANSMISSION SYNCHRONIZATION

(75) Inventors: Yongmin Ge, Sunnyvale, CA (US);
Ming Qu, San Jose, CA (US); Zhengyu Yuan, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 768 days.

(21) Appl. No.: 10/912,943

(22) Filed: Aug. 6, 2004

(65) Prior Publication Data

US 2006/0029176 A1    Feb. 9, 2006

(51) Int. Cl.
*H04L 7/00* (2006.01)
(52) U.S. Cl. ............... 375/354; 370/537; 341/101
(58) Field of Classification Search .......... 375/347, 375/354; 370/537; 341/101
See application file for complete search history.

(56) References Cited

U.S. PATENT DOCUMENTS

| | | | |
|---|---|---|---|
| 3,824,349 A | 7/1974 | Buchner | |
| 4,825,306 A | 4/1989 | Robers | |
| 5,550,874 A | 8/1996 | Lee | |
| 5,706,438 A * | 1/1998 | Choi et al. | 710/71 |
| 5,726,990 A * | 3/1998 | Shimada et al. | 370/536 |
| 5,757,807 A * | 5/1998 | Tezuka et al. | 370/541 |
| 5,808,571 A * | 9/1998 | Kuwata et al. | 341/100 |
| 5,946,327 A * | 8/1999 | Murphy | 370/517 |
| 6,140,946 A * | 10/2000 | Desrosiers et al. | 341/100 |
| 6,407,682 B1 * | 6/2002 | Jones | 341/100 |
| 6,512,804 B1 | 1/2003 | Johnson et al. | |
| 6,552,619 B2 * | 4/2003 | Shastri | 331/25 |
| 6,559,892 B1 * | 5/2003 | Kikuchi | 348/536 |
| 6,594,325 B1 | 7/2003 | Li | |
| 6,700,942 B1 | 3/2004 | Lai | |
| 6,710,726 B2 * | 3/2004 | Kim et al. | 341/100 |
| 6,906,570 B2 * | 6/2005 | Kim | 327/292 |
| 6,958,717 B1 * | 10/2005 | Minogue | 341/102 |
| 7,012,474 B2 * | 3/2006 | Yen | 331/74 |
| 7,106,227 B2 * | 9/2006 | Karlquist | 341/101 |
| 7,158,727 B2 * | 1/2007 | Pathak et al. | 398/155 |
| 7,227,918 B2 * | 6/2007 | Aung et al. | 375/355 |
| 2002/0067785 A1 * | 6/2002 | Tanahashi | 375/354 |
| 2003/0031133 A1 * | 2/2003 | Momtaz | 370/241 |
| 2003/0084362 A1 | 5/2003 | Wang | |
| 2004/0100947 A1 | 5/2004 | Masaki | |
| 2004/0114636 A1 * | 6/2004 | Gysel | 370/535 |
| 2004/0222826 A1 * | 11/2004 | Takeuchi et al. | 327/123 |
| 2005/0007840 A1 * | 1/2005 | Watanabe et al. | 365/200 |
| 2005/0058187 A1 * | 3/2005 | Groen et al. | 375/219 |

* cited by examiner

*Primary Examiner*—Jean B Corrielus
(74) *Attorney, Agent, or Firm*—MacPherson Kwok Chen & Heid LLP; Greg J. Michelson

(57) ABSTRACT

Systems and methods provide synchronization techniques across a number of communication channels. For example, in accordance with an embodiment of the present invention, a synchronization scheme is disclosed for synchronizing across multiple data transmission channels, with each transmission channel multiplexing parallel data into serial data.

17 Claims, 3 Drawing Sheets

DATA TRANSMISSION SYNCHRONIZATION

TECHNICAL FIELD

The present invention relates generally to communication systems and electrical circuits and, more particularly, to data synchronization techniques.

BACKGROUND

As the amount of data and the data rate increases, communication systems often must utilize a number of communication channels. For example, for multiple streams of parallel data, a transceiver may transfer each stream of parallel data through a corresponding serial data channel.

A drawback of a typical transceiver is that synchronization is not maintained across the serial data channels. For example, for some applications, it may be beneficial to maintain synchronization during serial data transmission of the high-speed data across a number of the communication channels to minimize the amount of complex circuitry or techniques at the receiver that may be necessary for resynchronization. As a result, there is a need for improved data communication techniques.

SUMMARY

Systems and methods are disclosed herein to provide synchronization techniques across a number of communication channels. For example, in accordance with an embodiment of the present invention, a synchronization scheme is disclosed for multiple data transmission channels. Each transmission channel may multiplex parallel data into serial data for transmission over the communication channel. The serial data across one or more of the communication channels may be synchronized, for example, so that the same corresponding parallel bit of data is transmitted at approximately the same time.

More specifically, in accordance with one embodiment of the present invention, an integrated circuit includes a synchronization circuit adapted to receive a first clock signal and a synchronization signal and provide at least a second clock signal and a third clock signal; a first divider circuit adapted to receive the second clock signal and provide a first divided clock signal; a second divider adapted to receive the third clock signal and the first divided clock signal and provide a second divided clock signal; at least one multiplexer adapted to receive the second divided clock signal and an input signal, which provides a number of parallel bits, and selectively provide the parallel bits under control of the second divided clock signal; and an output multiplexer adapted to receive the first divided clock signal and the parallel bits from the at least one multiplexer and provide a serial output signal based on the input signal.

In accordance with another embodiment of the present invention, a circuit includes a synchronization circuit adapted to receive a synchronization signal and provide at least a first clock signal; a divider circuit adapted to receive the at least first clock signal and provide at least a first divided down clock signal; and a multiplexer circuit adapted to receive the at least first divided down clock signal and an input signal, providing a number of parallel bits, and provide a serial output signal based on the input signal and under control of the at least first divided down clock signal.

In accordance with another embodiment of the present invention, a method for providing parallel to serial data conversion and data transmission synchronization across a number of communication channels includes providing a synchronous signal and a clock signal that are synchronized across the communication channels; generating a first divided down clock signal based on the synchronous signal and the clock signal for each of the communication channels; and multiplexing parallel input data bits into serial data bits under control of the first divided down clock signal, wherein the serial data bits are synchronized across the communication channels.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
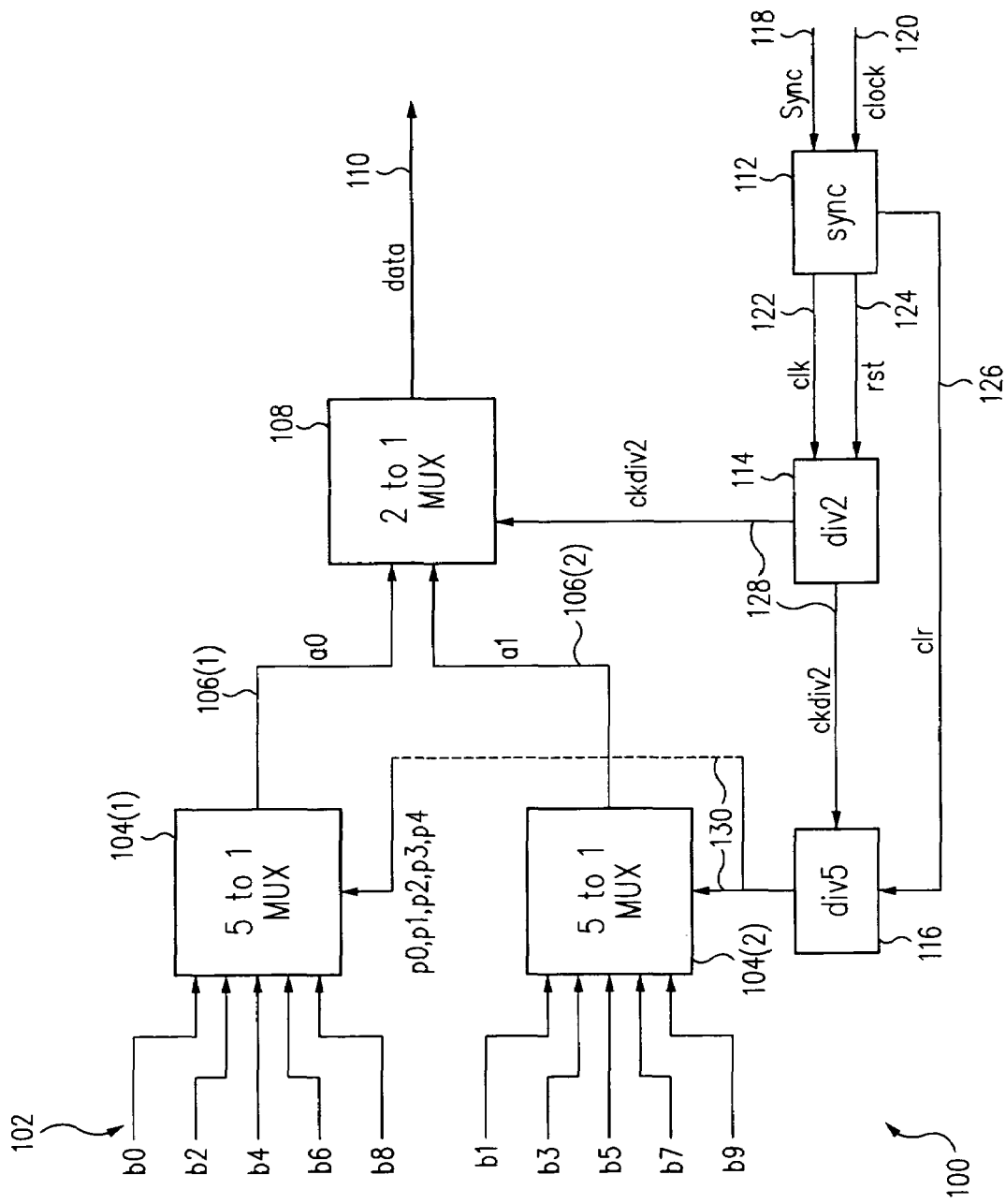
FIG. 1 shows a block diagram illustrating a serializer circuit in accordance with an embodiment of the present invention.

FIG. 1 shows a block diagram illustrating a serializer circuit 100 in accordance with an embodiment of the present invention. Serializer circuit 100 includes multiplexers 104 and 108, a synchronization circuit 112, and dividers 114 and 116.

Synchronization circuit 112 receives a synchronization signal (sync) 118 and a clock signal (clock) 120 and generates a clock signal (clk) 122, a clock signal (rst) 124, and a clock signal (clr) 126. Synchronization circuit 112 buffers synchronization signal 118 and clock signal 120 and utilizes clock signal 120 to retime synchronization signal 118 so that clock signal 124 is a delayed version (e.g., by one clock cycle) of synchronization signal 118.

Divider 114 (e.g., a divide by two frequency divider circuit) receives clock signal 122 and clock signal 124 and generates a clock signal (ckdiv2) 128. Divider 116 (e.g., a divide by five frequency divider circuit) receives clock signal 126 and clock signal 128 and generates a signal 130 (e.g., a clock signal providing five pulses labeled p0, p1, p2, p3, and p4).

Multiplexers 104 (which are separately referenced as multiplexers 104(1) and 104(2)) receive signal 130 and input signal 102. Input signal 102, for this exemplary implementation, represents ten bits of parallel data (e.g., labeled b0 through b9), with multiplexer 104(1) receiving bits b0, b2, b4, b6, and b8 of input signal 102 and multiplexer 104(2) receiving bits b1, b3, b5, b7, and b9 of input signal 102.

Under control of signal 130, multiplexer 104(1) selectively provides bits b0, b2, b4, b6, and b8 of input signal 102 as a signal 106(1) (labeled a0), while multiplexer 104(2) selectively provides bits b1, b3, b5, b7, and b9 of input signal 102 as a signal 106(2) (labeled a1). Multiplexer 108 receives signals 106(1) and 106(2) and, under control of clock signal 128, provides a signal 110 (e.g., serial output data based on parallel data provided by input signal 102).

Serializer circuit 100, for this exemplary implementation, represents a ten-to-one serializer that receives parallel input data (i.e., input signal 102) and provides serial output data for data transmission as controlled by a synchronization signal (i.e., synchronization signal 118). It should be understood, however, that serializer circuit 100 represents a specific implementation example to illustrate certain aspects of the present invention and that numerous modifications and variations are possible in accordance with the principles of the present invention. For example, serializer circuit 100 may be implemented as a two-to-one, a three-to-one, or any other ratio of parallel-to-serial conversion as is required or desired for a given application.

Serializer circuit 100, for example in accordance with an embodiment of the present invention, may be implemented in the transmission path of a transceiver, with serializer circuit 100 multiplexing low-speed parallel data into high-speed serial data that is provided to an output driver for transmission through a communication channel. As an example, a number of serializer circuits 100 may be implemented (e.g., within the transceiver) to provide their serial data through corresponding communication channels.

Furthermore, in accordance with an embodiment of the present invention, the serial data may be synchronized across the communication channels so that the corresponding parallel bit of data from different communication channels will be transmitted at approximately the same time. For example, different parallel data having bits b0 through b9 provided to each corresponding serializer circuit 100 within the transceiver will be transmitted at approximately the same time based upon synchronization techniques discussed herein (e.g., bit b0 will be transmitted at the same time through each communication channel, followed by bit b1, then bit b2, etc.).

Figure 2:
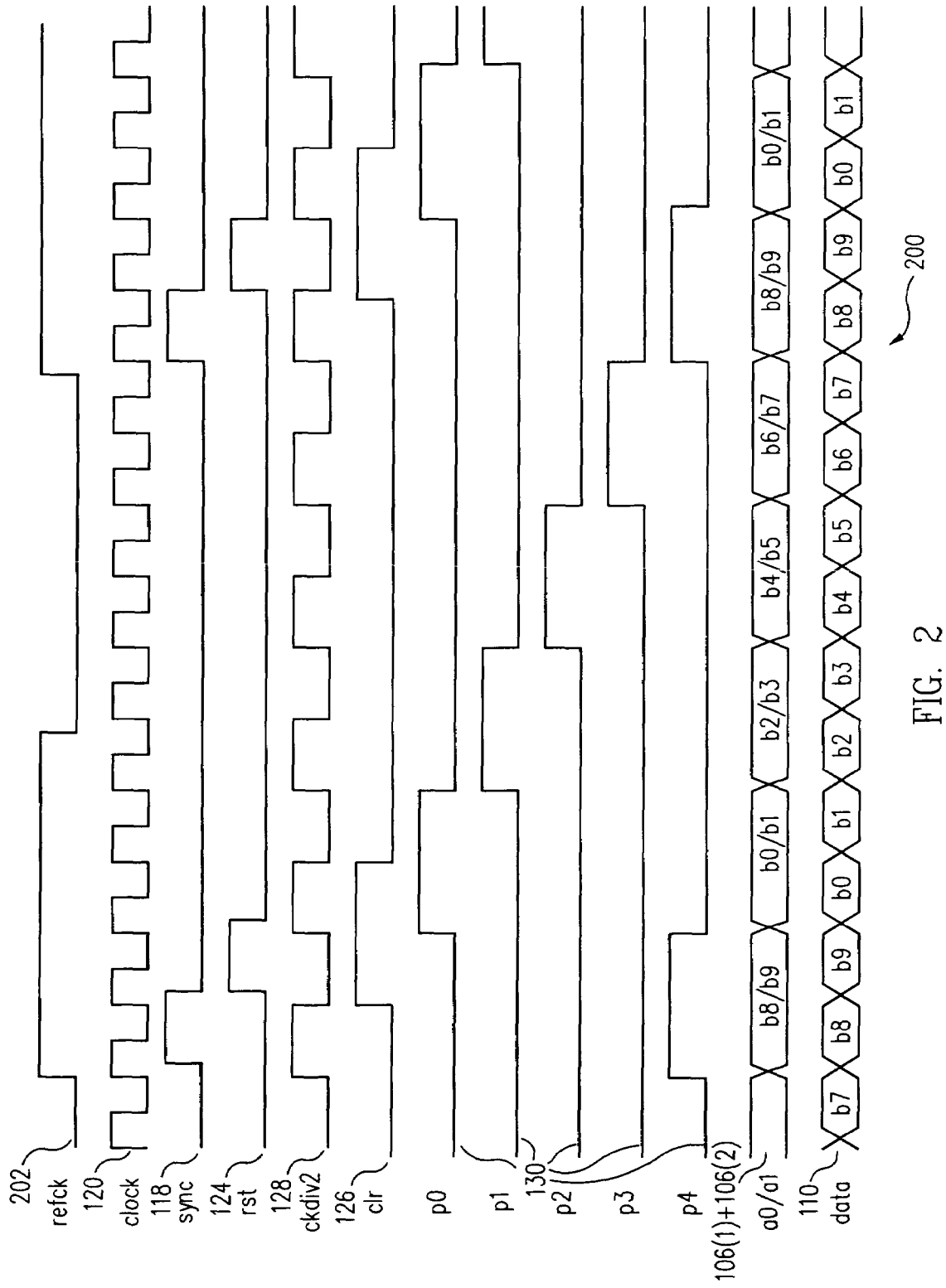
FIG. 2 shows a timing diagram for the serializer circuit of FIG. 1 in accordance with an embodiment of the present invention.

For example, FIG. 2 shows a timing diagram 200 for serializer circuit 100 of FIG. 1 in accordance with an embodiment of the present invention. Timing diagram 200, for example, provides exemplary waveforms for certain signals discussed in reference to the synchronization design of serializer circuit 100.

As an example, clock signal 120 and synchronization signal 118 may be provided by a phase locked loop (PLL) circuit based on a reference clock signal (refck) 202. Clock signal 120 and synchronization signal 118 may be further provided to a number of serializer circuits 100 corresponding to each communication channel to provide synchronization across the communication channels.

Figure 3:
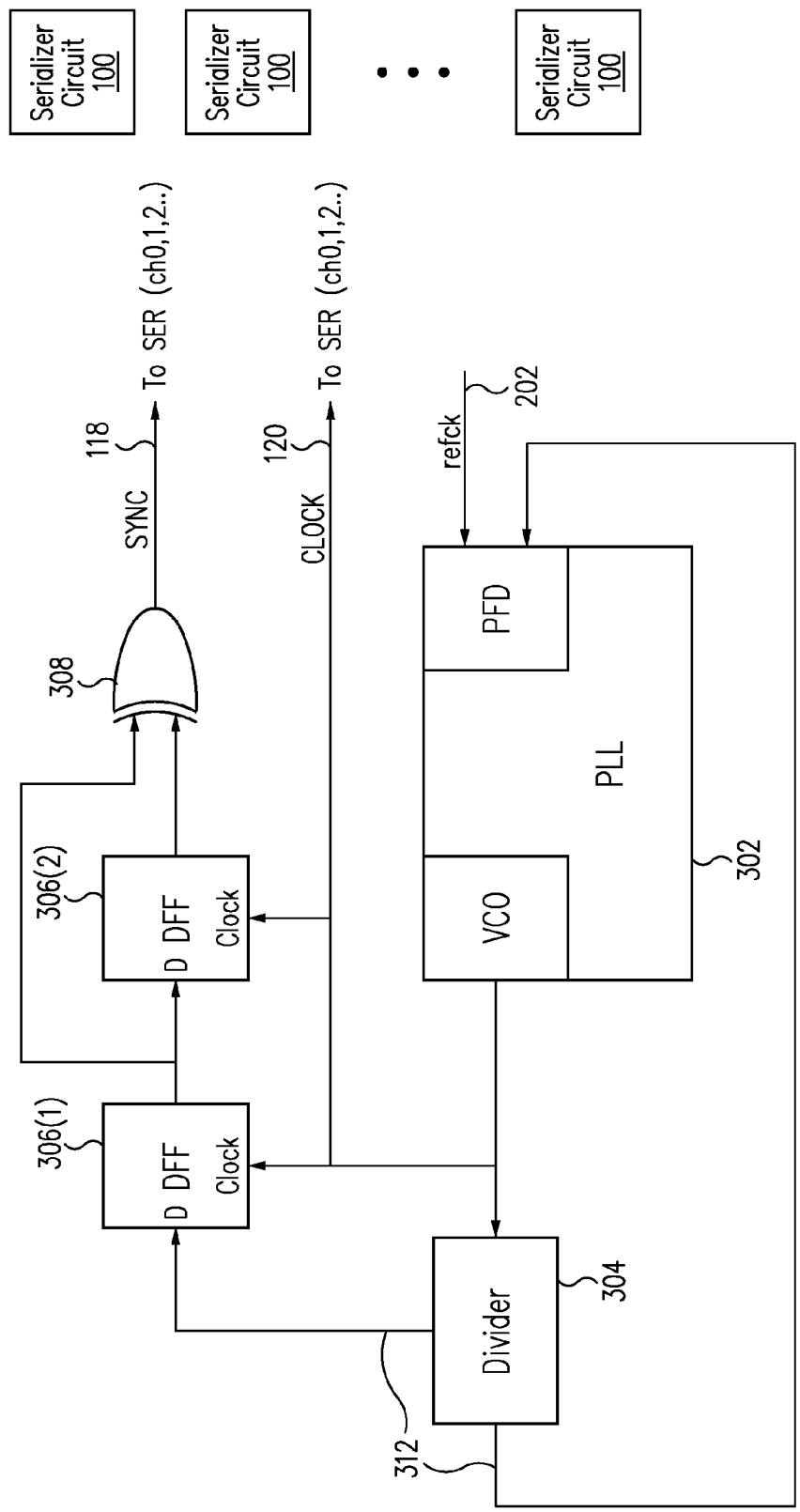
FIG. 3 shows a block diagram illustrating a reference circuit for providing signals to one or more of the serializer circuits of FIG. 1 in accordance with an embodiment of the present invention.

For example, FIG. 3 shows a block diagram illustrating a reference circuit 300 for providing signals to one or more of serializer circuits 100 of FIG. 1 in accordance with an embodiment of the present invention. Reference circuit 300 includes a phased locked loop (PLL) 302, a divider 304, registers 306 (e.g., D flip flops), and a logic gate 308.

PLL 302 (e.g., having a voltage controlled oscillator (VCO) and a phase and frequency detector (PFD)) receives reference clock signal 202 and provides clock signal 120. Clock signal 120 is provided to divider 304, which divides down clock signal 120 and provides a clock signal 312 to register 306(1) and PLL 302.

Register 306(1) also receives clock signal 120 and provides its output signal to register 306(2), which also receives clock signal 120. Registers 306(1) and 306(2) provide their output signals to logic gate 308 (e.g., an exclusive OR gate), which provides synchronization signal 118. Clock signal 120 and synchronization signal 118 may be provided to a number of serializer circuits 100 (as shown in FIG. 3) for corresponding communication channels so that serializer circuits 100 are synchronized (e.g., each serializer circuit 100 associated with a communication channel, such as channel (ch) 0, 1, 2, etc., are synchronized with each other).

For this exemplary implementation, in accordance with an embodiment of the present invention, a synchronization scheme for data transmission is disclosed that utilizes synchronization signal 118 and clock signal 120 (e.g., a high-speed clock signal) originating from PLL 302 of reference circuit 300 to align the serial output data from different channels (e.g., data 110 from different serializer circuits 100). This alignment is accomplished by controlling the operation of multiplexers 104 (e.g., 5 to 1 multiplexers) and multiplexer 108 (e.g., 2 to 1 multiplexer) within serializer circuits 100 (FIG. 1).

As an example, as illustrated in FIG. 2, a pulse of synchronization signal 118 may be triggered by a rising edge of reference clock signal 202. Each serializer circuit 100 receives corresponding input signal 102 (e.g., parallel data bits b0 through b9 which may provide different data to each serializer circuit 100) and provides signal 110 (e.g., high-speed serial data).

Signal 110 may be synchronized across serializer circuits 100 due to the generation of clock signal 124 for divider 114 based on synchronization signal 118. Because synchronization signal 118 is provided uniformly to serializer circuits 100, clock signal 124 generated from synchronization signal 118 has little or no skew as measured across different channels (or serializer circuits 100).

Clock signal 124 forces divider 114 to provide clock signal 128, which has the same phase across different channels. Consequently, multiplexer 108, which is controlled by corresponding clock signal 128 within each serializer circuit 100, provides signal 110 having the same corresponding input bit from signal 106(1) or signal 106(2) at approximately the same time across different serializer circuits 100.

Signals 106(1) and 106(2) are synchronized based on clock signals 126 and 128 provided to divider 116 (e.g., a counter), which generates clock signal 130 that provides five pulses labeled p0 through p4 (FIG. 2) of different phases to multiplexers 104. In this exemplary implementation, the pulse p0 of clock signal 130 is triggered by clock signals 126 and 128 as shown in FIG. 2.

Because clock signals 126 and 128 are uniform and synchronized across different serializer circuits 100, the pulses p0 through p4 of clock signal 130 for each corresponding serializer circuit 100 will not have any (or very little) phase difference across serializer circuits 100. Consequently, multiplexer 108 within serializer circuit 100 for each communication channel will provide the same corresponding parallel bit (e.g., bit b0, b1, . . . , or b9 of input signal 102) at approximately the same time.

In accordance with one or more embodiments of the present invention, synchronization schemes are disclosed. For example, a synchronization scheme is disclosed for transceiver serializer circuits having corresponding communication channels, such that one or more of the serializer circuits are synchronized.

In one exemplary implementation, multiplexers within serializer circuits are synchronized to provide the same corresponding parallel bit. For example, the synchronization scheme may align the serial output so that the serial output from different channels will transmit the same parallel bit data at the same time (e.g., bit b0, b1, b2, . . . , b9). Furthermore, for example, the serial output may provide a certain parallel data bit (e.g., data bit b0) after each rising edge of a reference clock (e.g., the pulse p0 of clock signal 130 or the pulse of synchronization signal 118).

Embodiments described above illustrate but do not limit the invention. It should also be understood that numerous modifications and variations are possible in accordance with the principles of the present invention. Accordingly, the scope of the invention is defined only by the following claims.

We claim:

1. An integrated circuit comprising:
   a synchronization circuit adapted to receive a first clock signal and a synchronization signal and provide at least a second clock signal and a third clock signal;
   a first divider circuit adapted to receive the second clock signal and provide a first divided clock signal;
   a second divider adapted to receive the third clock signal and the first divided clock signal and provide a second divided clock signal;
   at least two multiplexers adapted to receive the second divided clock signal and an input signal, which provides a number of parallel bits, and selectively provide the parallel bits under control of the second divided clock signal; and
   an output multiplexer adapted to receive the first divided clock signal and the parallel bits from the at least two multiplexers and provide a serial output signal based on the input signal.

2. The integrated circuit of claim 1, wherein the at least two multiplexers comprises two multiplexers, each receiving half of the parallel bits of the input signal.

3. The integrated circuit of claim 1, further comprising a reference circuit having a phase locked loop circuit, wherein the reference circuit is adapted to receive a reference clock signal and provide the first clock signal and the synchronization signal.

4. The integrated circuit of claim 1, wherein the synchronization circuit is further adapted to provide a fourth clock signal, with the first divider circuit adapted to receive the fourth clock signal.

5. The integrated circuit of claim 1, wherein the synchronization circuit, the first and second divider circuit, the at least two multiplexers, and the output multiplexer comprise a serializer circuit, the integrated circuit further comprising a plurality of the serializer circuits having corresponding serial output signals for corresponding communication channels.

6. The integrated circuit of claim 5, wherein the serial output signals for the serializer circuits are synchronized across the communication channels.

7. The integrated circuit of claim 5, wherein the serial output signals for the serializer circuits are synchronized across the communication channels with corresponding ones of the parallel bits for each of the serial output signals transmitted at approximately the same time.

8. The integrated circuit of claim 1, wherein the synchronization circuit, the first and second divider circuit, the at least two multiplexers, and the output multiplexer comprise a serializer circuit to provide parallel to serial conversion, the integrated circuit further comprising a number of the serializer circuits which are synchronized based upon the synchronization signal.

9. A circuit comprising:
   a synchronization circuit adapted to receive a synchronization signal and provide at least a first clock signal;
   a divider circuit adapted to receive the at least first clock signal and provide at least a first divided down clock signal; and
   a multiplexer circuit adapted to receive the at least first divided down clock signal and an input signal, providing a number of parallel bits, and selectively provide from among the parallel bits a serial output signal based on the input signal and under control of the at least first divided down clock signal;
   wherein the multiplexer circuit comprises a first and a second multiplexer, each receiving half of the parallel bits of the input signal and the first divided down clock signal, and a third multiplexer coupled to the first and second multiplexer and receiving the second divided down clock signal, the third multiplexer receiving output signals from the first and second multiplexer and providing the serial output signal; and
   wherein the synchronization circuit, the divider circuit, and the multiplexer circuit comprise a serializer circuit, the circuit further comprising a number of the serializer circuits, which are synchronized based upon the synchronization signal.

10. The circuit of claim 9, further comprising a reference circuit adapted to receive a reference clock signal and provide the synchronization signal to the synchronization circuit.

11. The circuit of claim 9, wherein the serializer circuits provide corresponding ones of the parallel bits in a synchronized fashion via the serial output signals of the multiplexer circuits.

12. The circuit of claim 9, wherein each of the synchronization circuits is further adapted to receive a clock signal, which is provided in a uniform fashion within the corresponding serializer circuit.

13. The circuit of claim 9, wherein the at least first clock signal comprises a first, a second, and a third clock signal.

14. The circuit of claim 9, wherein the divider circuit comprises a first divider circuit providing the first divided down clock signal, and a second divider circuit providing a second divided down clock signal.

15. A method for providing parallel to serial data conversion and data transmission synchronization across a number of communication channels, the method comprising:
   providing a synchronous signal and a clock signal that are synchronized across the communication channels;
   generating a first divided down clock signal based on the synchronous signal and the clock signal for each of the communication channels;
   generating a second divided down clock signal based on the synchronous signal and the clock signal for each of the communication channels; and
   multiplexing parallel input data bits into serial data bits under control of the first divided down clock signal and the second divided down clock signal, wherein the serial data bits are synchronized across the communication channels.

16. The method of claim 15, further comprising:
   providing a reference clock signal; and
   generating the synchronous signal and the clock signal based on the reference clock signal.

17. The method of claim 15, wherein the parallel input data bits for each of the communication channels are transmitted synchronously through the communication channels.

* * * * *